(12) United States Patent  
Fujita

(10) Patent No.: US 11,145,531 B2  
(45) Date of Patent: Oct. 12, 2021

(54) SUBSTRATE FIXING DEVICE

(71) Applicant: SHINKO ELECTRIC INDUSTRIES CO., LTD., Nagano (JP)

(72) Inventor: Kazuhiro Fujita, Shiga (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 314 days.

(21) Appl. No.: 15/956,852

(22) Filed: Apr. 19, 2018

(65) Prior Publication Data

US 2018/0374735 A1 Dec. 27, 2018

(30) Foreign Application Priority Data

Jun. 23, 2017 (JP) .............................. JP2017-123360

(51) Int. Cl.
| | |
|---|---|
| *H01L 21/683* | (2006.01) |
| *H01L 21/673* | (2006.01) |
| *H01L 21/687* | (2006.01) |
| *H01L 21/67* | (2006.01) |
| *H02N 13/00* | (2006.01) |

(52) U.S. Cl.
CPC ........ *H01L 21/6833* (2013.01); *H01L 21/673* (2013.01); *H01L 21/67103* (2013.01); *H01L 21/67109* (2013.01); *H01L 21/6831* (2013.01); *H01L 21/68757* (2013.01); *H02N 13/00* (2013.01)

(58) Field of Classification Search
CPC ............. H01L 21/6831; H01L 21/6833; H01L 21/67098; H01L 21/67103; H01L 21/67109; H01L 21/67248; H01L 21/673; H01L 21/68755; H02N 13/00; H01H 59/0009
See application file for complete search history.

(56) References Cited

U.S. PATENT DOCUMENTS

| | | | |
|---|---|---|---|
| 8,503,155 B2 | 8/2013 | Migita | |
| 2002/0036881 A1* | 3/2002 | Shamouilian | ......... C04B 35/185 |
| | | | 361/234 |
| 2011/0058303 A1* | 3/2011 | Migita | ................... H02N 13/00 |
| | | | 361/234 |

(Continued)

FOREIGN PATENT DOCUMENTS

| | | |
|---|---|---|
| JP | 2012-129539 | 7/2012 |
| KR | 10-2017-0025964 | 3/2017 |
| WO | 2010/061740 | 6/2010 |

OTHER PUBLICATIONS

Office Action dated Oct. 6, 2020 issued with respect to the basic Japanese Patent Application No. 2017-123360.

*Primary Examiner* — Gustavo A Rosario-Benitez  
(74) *Attorney, Agent, or Firm* — IPUSA, PLLC

(57) ABSTRACT

A substrate fixing device includes a baseplate, an adhesive layer on the baseplate, and an electrostatic chuck on the adhesive layer. The adhesive layer includes a first layer and a second layer. The second layer is between the first layer and the electrostatic chuck. The thermal conductivity of the first layer is higher in a stacking direction in which the baseplate, the adhesive layer, and the electrostatic chuck are stacked than in a plane direction perpendicular to the stacking direction. The thermal conductivity of the second layer is higher in the plane direction than in the stacking direction.

9 Claims, 4 Drawing Sheets

(56) References Cited

U.S. PATENT DOCUMENTS

| | | | |
|---|---|---|---|
| 2011/0156249 A1* | 6/2011 | Chang | H01L 23/481 |
| | | | 257/737 |
| 2011/0229837 A1 | 9/2011 | Migita | |
| 2012/0134065 A1* | 5/2012 | Furuya | H01L 21/6833 |
| | | | 361/234 |
| 2012/0299253 A1* | 11/2012 | Kosakai | H01L 21/67103 |
| | | | 279/128 |
| 2013/0081796 A1* | 4/2013 | Horiuchi | H01L 21/50 |
| | | | 165/185 |
| 2013/0161305 A1* | 6/2013 | Ptasienski | H05B 3/20 |
| | | | 219/201 |
| 2016/0118285 A1* | 4/2016 | Takada | H01L 21/67109 |
| | | | 361/234 |
| 2016/0276196 A1* | 9/2016 | Parkhe | H01L 21/6831 |
| 2017/0133258 A1* | 5/2017 | Miwa | H01L 21/67103 |
| 2017/0176850 A1* | 6/2017 | Chen | G03F 7/20 |
| 2018/0269097 A1* | 9/2018 | Maeta | H01L 21/6833 |

\* cited by examiner

SUBSTRATE FIXING DEVICE

CROSS-REFERENCE TO RELATED APPLICATION

This application is based upon and claims the benefit of priority of the prior Japanese Patent Application No. 2017-123360, filed on Jun. 23, 2017, the entire contents of which are incorporated herein by reference.

FIELD

A certain aspect of the embodiment discussed herein is related to substrate fixing devices.

BACKGROUND

Substrate fixing devices in which an electrostatic chuck is mounted on a baseplate through an adhesive layer to attract and hold a wafer, which is an object of attraction, onto a surface of the electrostatic chuck have been known. Here, it is assumed that a direction in which the baseplate, the adhesive layer, and the electrostatic chuck are stacked is a Z-direction and the surface of the electrostatic chuck is an XY plane surface perpendicular to the Z-direction.

According to such substrate fixing devices, for example, the electrostatic chuck contains an electrostatic electrode and a heating element, and the baseplate includes a cooling mechanism. The in-plane surface temperature distribution of the electrostatic chuck to attract and hold a wafer is controlled using the heating element contained in the electrostatic chuck and the cooling mechanism of the baseplate. To reduce variations in the surface temperature (namely, to improve the thermal uniformity in the XY in-plane direction) of the electrostatic chuck, the adhesive layer contains a filler such as metal particles or ceramic particles. (See, for example, Japanese Laid-open Patent Publication No. 2012-129539.)

SUMMARY

According to an aspect of the present invention, a substrate fixing device includes a baseplate, an adhesive layer on the baseplate, and an electrostatic chuck on the adhesive layer. The adhesive layer includes a first layer and a second layer. The second layer is between the first layer and the electrostatic chuck. The thermal conductivity of the first layer is higher in a stacking direction in which the baseplate, the adhesive layer, and the electrostatic chuck are stacked than in a plane direction perpendicular to the stacking direction. The thermal conductivity of the second layer is higher in the plane direction than in the stacking direction.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
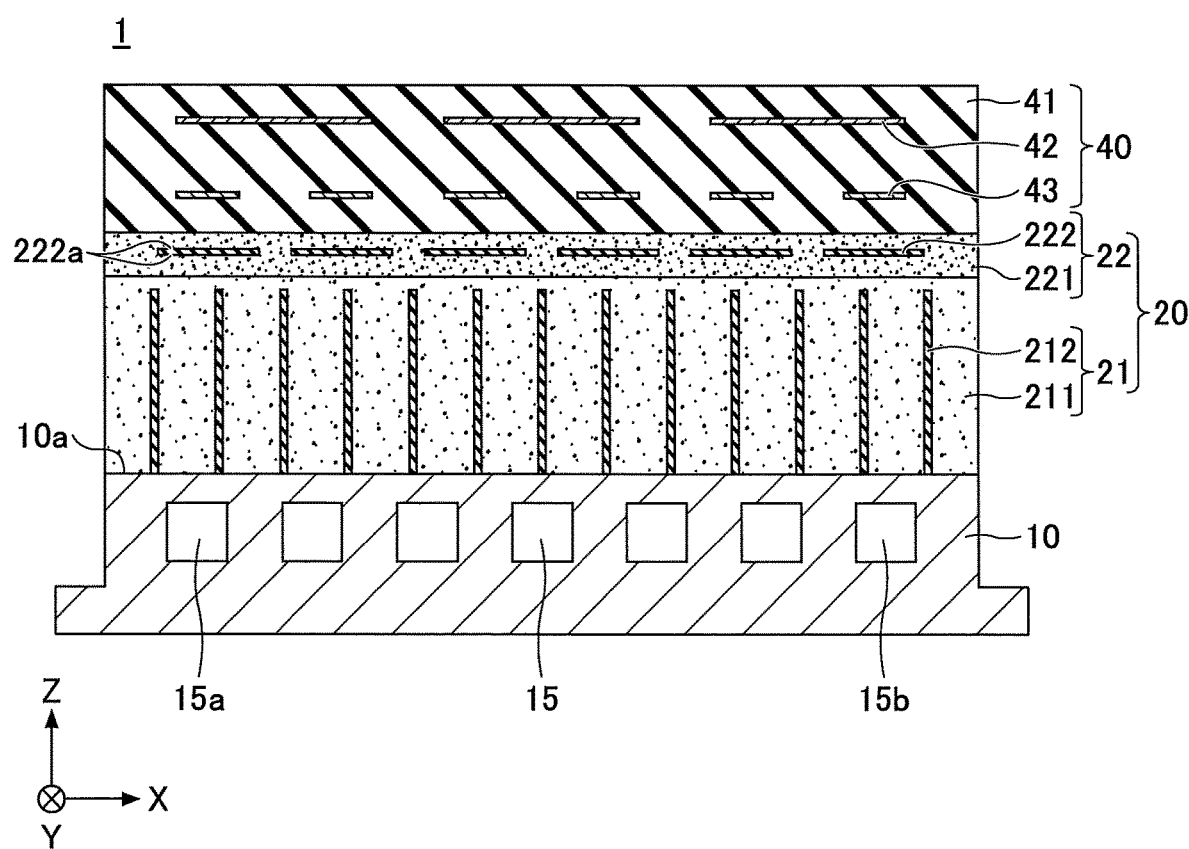
FIG. 1 is a simplified sectional view of a substrate fixing device according to an embodiment of the present invention.

In the above-described substrate fixing devices, reducing the thickness of the adhesive layer decreases thermal resistance in the Z-direction, thus improving thermal response in the Z-direction. The problem of the generation of cracks in the adhesive layer and the problem of the occurrence of delamination at the interface between the electrostatic chuck and the adhesive layer or the interface between the adhesive layer and the baseplate, however, occur because of the thermal stress difference due to the difference in coefficient of thermal expansion between the electrostatic chuck (formed of, for example, ceramic) and the baseplate (formed of, for example, metal).

It is possible to reduce the thermal stress difference due to the difference in coefficient of thermal expansion between the electrostatic chuck and the baseplate and thus to reduce cracks and delamination by increasing the thickness of the adhesive layer, which, however, causes a problem in that the thermal response in the Z-direction degrades.

According to an aspect of the present invention, a substrate fixing device in which the generation of cracks and the occurrence of interface delamination in an adhesive layer are reduced and the thermal response in the Z-direction is improved is provided.

One or more preferred embodiments of the present invention will be explained with reference to accompanying drawings. In the following description, the same elements or components are referred to using the same reference numeral, and a repetitive description thereof may be omitted.

First, a structure of a substrate fixing device according to an embodiment is described.

FIG. 1 is a simplified sectional view of a substrate fixing device according to an embodiment of the present invention.

Referring to FIG. 1, a substrate fixing device 1 includes a baseplate 10, an adhesive layer 20 provided on the baseplate 10, and an electrostatic chuck 40 provided on the adhesive layer 20.

In the following description, the substrate fixing device 1 is described using an XYZ coordinate system, which is a Cartesian coordinate system, as defined as illustrated in the drawings. For example, as illustrated in FIG. 1, an upper surface 10a of the baseplate 10 is an XY-plane surface, and the baseplate 10, the adhesive layer 20, and the electrostatic chuck 40 are stacked in the direction indicated by arrow Z (Z-direction), which is perpendicular to the XY plane. The Z-direction, which is the thickness direction of the substrate fixing device 1, may be referred to as "stacking direction." Directions perpendicular to the stacking direction (Z-direction) may be collectively referred to as "plane direction" (XY in-plane direction).

The baseplate 10 is a member for mounting the electrostatic chuck 40. The thickness of the baseplate 10 may be, for example, approximately 20 mm to approximately 50 mm. The baseplate 10 is formed of, for example, aluminum, and may also be used as, for example, an electrode for controlling plasma. By feeding the baseplate 10 with predetermined high-frequency electric power, it is possible to control energy for causing, for example, generated ions in the state of plasma to collide with a wafer attracted onto the electrostatic chuck 40 to effectively perform etching.

A water conduit 15 is provided in the baseplate 10. The water conduit 15 includes a cooling water introduction part 15a at one end and a cooling water discharge part 15b at the other end. The water conduit 15 may be connected to a cooling water controller (not depicted) provided outside the substrate fixing device 1. The cooling water controller introduces cooling water into the water conduit 15 from the cooling water introduction part 15a and discharges the cooling water from the cooling water discharge part 15b. By cooling the baseplate 10 by circulating cooling water through the water conduit 15, it is possible to cool a wafer attracted onto the electrostatic chuck 40. In addition to the water conduit 15, for example, a gas conduit for introducing an inert gas for cooling a wafer attracted onto the electrostatic chuck 40 may be provided in the baseplate 10.

The adhesive layer 20 includes at least two layers of a first layer 21 provided on the baseplate 10 and a second layer 22 provided on the electrostatic chuck 40.

The first layer 21 is stacked on the upper surface 10a of the baseplate 10. The thickness of the first layer 21 may be, for example, approximately 0.5 mm to approximately 1.5 mm. The thermal conductivity of the first layer 21 is higher in the stacking direction (Z-direction) than in the plane direction (XY in-plane direction). Specifically, the first layer 21 may include, for example, a resin 211 and a large number of anisotropic heat transfer materials 212 contained in the resin 211. The thermal conductivity of the heat transfer materials 212 is higher in the Z-direction than in the XY in-plane direction. Examples of the resin 211 include epoxy resins, bismaleimide-triazine resins, silicone resins, and phenolic resins of high thermal conductivity and high heat resistance.

Examples of the heat transfer materials 212 include carbon nanotubes, which are placed in the resin 211 to be elongated in the stacking direction (Z-direction). That is, carbon nanotubes are oriented so that the longitudinal direction of the carbon nanotubes coincides with the stacking direction. A carbon nanotube is a substantially cylindrically-shaped (linearly-shaped) carbon crystal of approximately 0.7 nm to approximately 70 nm in diameter, and may have a longitudinal thermal conductivity of, for example, approximately 3000 W/mk.

Here, "being elongated in the stacking direction (Z-direction)" means that each heat transfer material 212 is elongated substantially in the stacking direction (Z-direction) to make the thermal conductivity of the first layer 21 higher in the stacking direction (Z-direction) than in the plane direction (XY in-plane direction). That is, "being elongated in the stacking direction (Z-direction)" does not mean that each heat transfer material 212 is elongated exactly in the stacking direction (Z-direction).

The second layer 22 is stacked on the upper surface of the first layer 21. The second layer 22 is thinner than the first layer 21, and may have a thickness of, for example, approximately 0.1 mm to approximately 0.3 mm. The thermal conductivity of the second layer 22 is higher in the plane direction (XY in-plane direction) than in the stacking direction (Z-direction). Specifically, the second layer 22 may include, for example, a resin 221 and a large number of anisotropic heat transfer materials 222 contained in the resin 221. The thermal conductivity of the heat transfer materials 222 is higher in the XY in-plane direction than in the Z-direction. Examples of the resin 221 include epoxy resins, bismaleimide-triazine resins, silicone resins, and phenolic resins of high thermal conductivity and high heat resistance.

Examples of the heat transfer materials 222 include carbon sheets. Specifically, for example, single-layer graphite sheets or laminates of graphite sheets may be used as the heat transfer materials 222 and may be placed at predetermined intervals in the plane direction (an XY plane) in the resin 221 to have respective main surfaces 222a parallel to the plane direction (an XY plane). The thermal conductivity of a graphite sheet may be, for example, approximately 300 W/mK or more in the XY in-plane direction and approximately 3 W/mK in the Z-direction. The thermal conductivity of a laminate of graphite sheets may be, for example, approximately 1500 W/mK or more in the XY in-plane direction and approximately 8 W/mK in the Z-direction.

Here, "having main surfaces parallel to the plane direction (an XY plane)" means that the respective main surfaces 222a of the heat transfer materials 222 are substantially parallel to the plane direction (an XY plane) to make the thermal conductivity of the second layer 22 higher in the plane direction (XY in-plane direction) than in the stacking direction (Z-direction). That is, "having main surfaces parallel to the plane direction (an XY plane)" does not mean that the respective main surfaces 222a of the heat transfer materials 222 are exactly parallel to the plane direction (an XY plane).

In place of single-layer graphite sheets or laminates of graphite sheets, other carbon sheets such as single-layer graphene sheets or laminates of graphene sheets may be used as the heat transfer materials 222.

The electrostatic chuck 40 is provided on the adhesive layer 20. The electrostatic chuck 40 includes a substrate 41, an electrostatic electrode 42, and a heating element 43. The electrostatic chuck 40 is, for example, a Johnsen-Rahbek electrostatic chuck. Alternatively, the electrostatic chuck 40 may be a Coulombic electrostatic chuck.

The substrate 41 is a dielectric. Suitable materials for the substrate 41 include, for example, ceramics such as aluminum oxide ($Al_2O_3$) and aluminum nitride (AlN). The thickness of the substrate 41 may be, for example, approximately 1 mm to approximately 10 mm. The relative permittivity (at 1 kHz) of the substrate 41 may be, for example, approximately 9 to approximately 10.

The electrostatic electrode 42 is a thin-film electrode buried in the substrate 41. The electrostatic electrode 42 is connected to a power supply disposed outside the substrate fixing device 1. When a predetermined voltage is applied to the electrostatic electrode 42, an electrostatic attraction force is generated between the electrostatic electrode 42 and a wafer. As a result, the wafer can be attracted and held onto a placement surface of the substrate 41 of the electrostatic chuck 40. The attraction and holding force increases as the voltage applied to the electrostatic electrode 42 increases. The electrostatic electrode 42 may have either a monopolar shape or a bipolar shape. Suitable materials for the electrostatic electrode 42 include, for example, tungsten (W) and molybdenum (Mo).

The heating element 43 is buried in the substrate 41. When a voltage is applied to the heating element 43 from outside the substrate fixing device 1, the heating element 43 generates heat and heats the placement surface of the substrate 41 to a predetermined temperature. The heating element 43 can heat the placement surface of the substrate 41 up to, for example, approximately 250° C. to approximately 300° C. Suitable materials for the heating element 43 include, for example, copper (Cu), tungsten (W), and nickel (Ni).

Next, a method of manufacturing a substrate fixing device according to this embodiment is described.

FIGS. 2A through 2D are diagrams illustrating a process of manufacturing a substrate fixing device according to this embodiment.

Figure 2A:
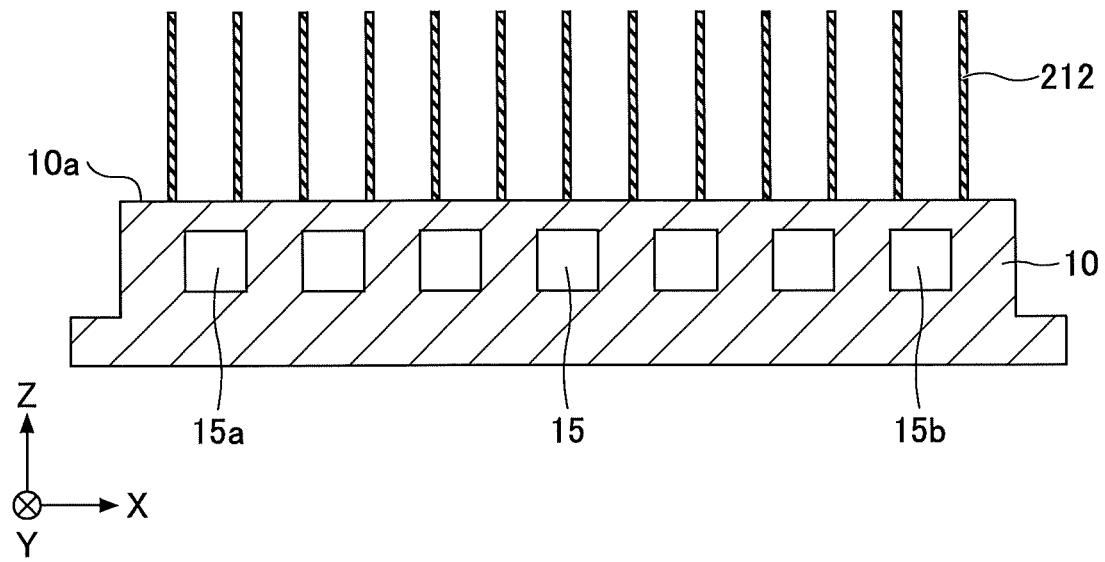
FIGS. 2A through 2D are diagrams illustrating a process of manufacturing a substrate fixing device according to the embodiment.
Figure 2B:
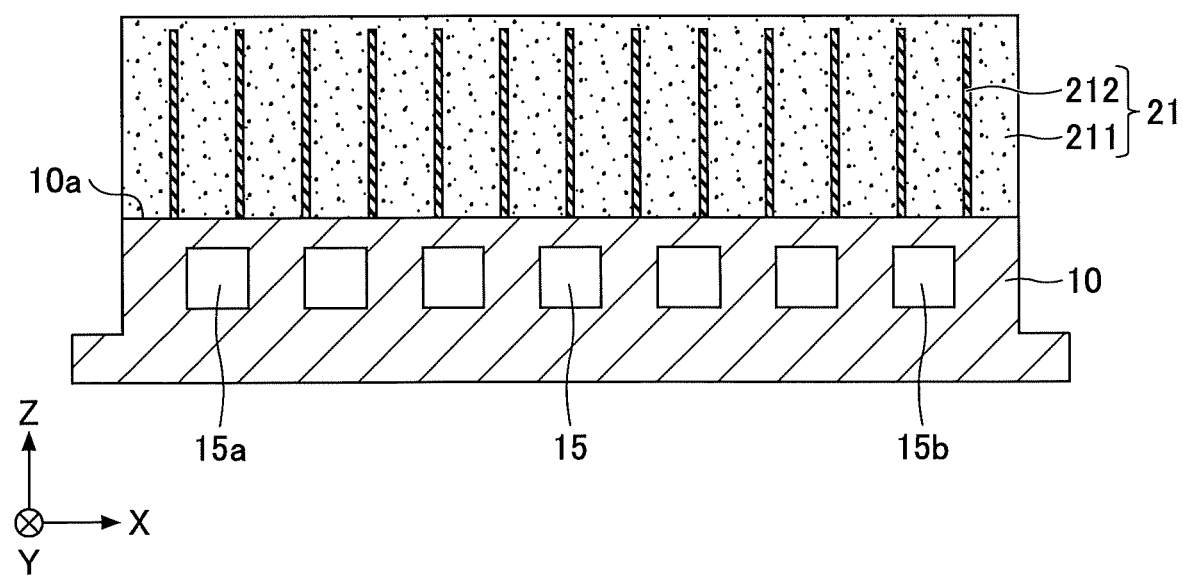

First, in the process depicted in FIGS. 2A and 2B, the baseplate 10 in which the water conduit 15, etc., are preformed is prepared, and the first layer 21 that contains the heat transfer materials 212 in the resin 211 is formed on the upper surface 10a of the baseplate 10.

For example, when the heat transfer materials 212 are carbon nanotubes, the carbon nanotubes are caused to stand close together on the upper surface 10a of the baseplate 10 as illustrated in FIG. 2A. Specifically, for example, a metal catalyst layer (not depicted) is formed by a process such as sputtering on the upper surface 10a of the baseplate 10. Suitable materials for the metal catalyst layer include, for example, iron (Fe), cobalt (Co), and nickel (Ni). The thickness of the metal catalyst layer may be, for example, approximately a few nanometers.

Next, the baseplate 10 on which the metal catalyst layer is formed is placed in a heating furnace adjusted to a predetermined pressure and temperature, and carbon nanotubes are formed on the metal catalyst layer by chemical vapor deposition (CVD). The pressure and temperature of the heating furnace may be, for example, 100 Pa and 600° C. Examples of process gases include acetylene gas, and examples of carrier gases include argon gas and hydrogen gas. The carbon nanotubes are formed on the metal catalyst layer in a direction perpendicular to the upper surface 10a of the baseplate 10. The height of the tips of the carbon nanotubes from the upper surface 10a may be controlled by the growth time of the carbon nanotubes.

Next, as illustrated in FIG. 2B, the resin 211 in liquid or paste form is applied onto the upper surface 10a of the baseplate 10, using, for example, a dispenser, to cover the carbon nanotubes, and is heated to a predetermined temperature to be cured. As a result, the first layer 21 containing the heat transfer materials 212 in the resin 211 is formed on the upper surface 10a of the baseplate 10. The material of the resin 211 is as described above.

The heat transfer materials 212, however, do not have to be formed on the upper surface 10a of the baseplate 10 as illustrated in FIG. 2A. For example, the first layer 21 containing the heat transfer materials 212 in the resin 211 is formed in advance separately from the baseplate 10. Then, the first layer 21 containing the heat transfer materials 212 in the resin 211 may be bonded to the upper surface 10a of the baseplate 10 through another adhesive layer. Alternatively, the first layer 21 containing the heat transfer materials 212 in the resin 211 may be directly bonded to the upper surface 10a of the baseplate 10 by thermocompression bonding.

Figure 2C:
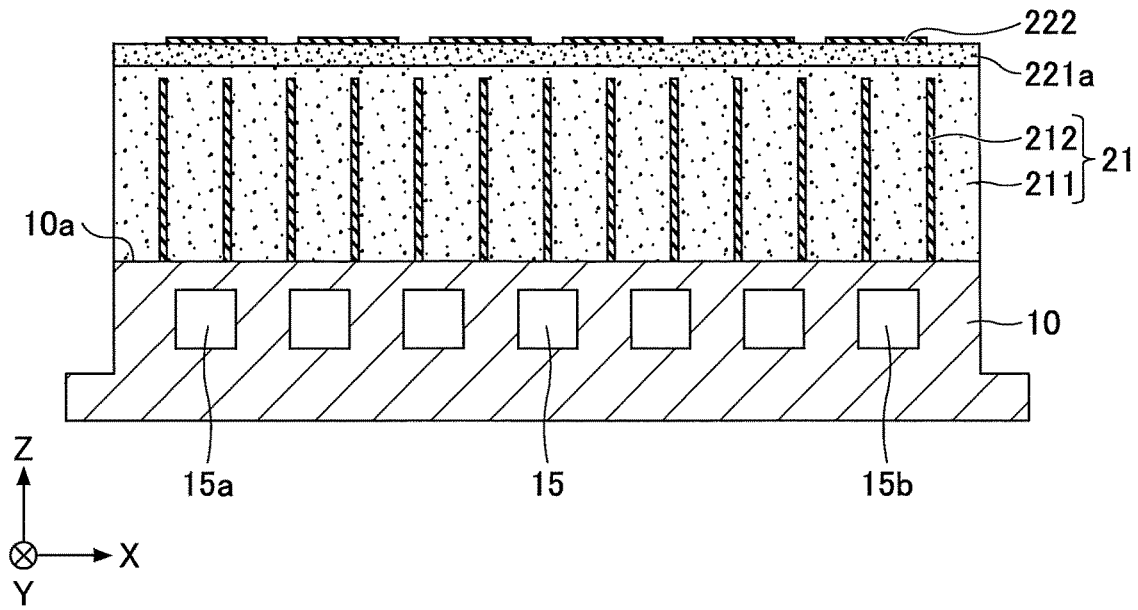

Next, in the process depicted in FIG. 2C, the upper surface of the first layer 21 is laminated with an insulating resin film 221a that becomes part of the resin 221 of the second layer 22. It is preferable to laminate the first layer 21 with the insulating resin film 221a in a vacuum because doing so makes it possible to prevent inclusion of voids. The insulating resin film 221a is left semi-cured (in B-stage) without being completely cured. Because of the adhesive force of the semi-cured insulating resin film 221a, the insulating resin film 221a is temporarily fixed onto the first layer 21.

Next, the heat transfer materials 222 are placed on the insulating resin film 221a. For example, carbon sheets such as single-layer graphite sheets, laminates of graphite sheets, single-layer graphene sheets, or laminates of graphene sheets may be used as the heat transfer materials 222. Because of the adhesive force of the semi-cured insulating resin film 221a, the heat transfer materials 222 are temporarily fixed onto the insulating resin film 221a.

Figure 2D:
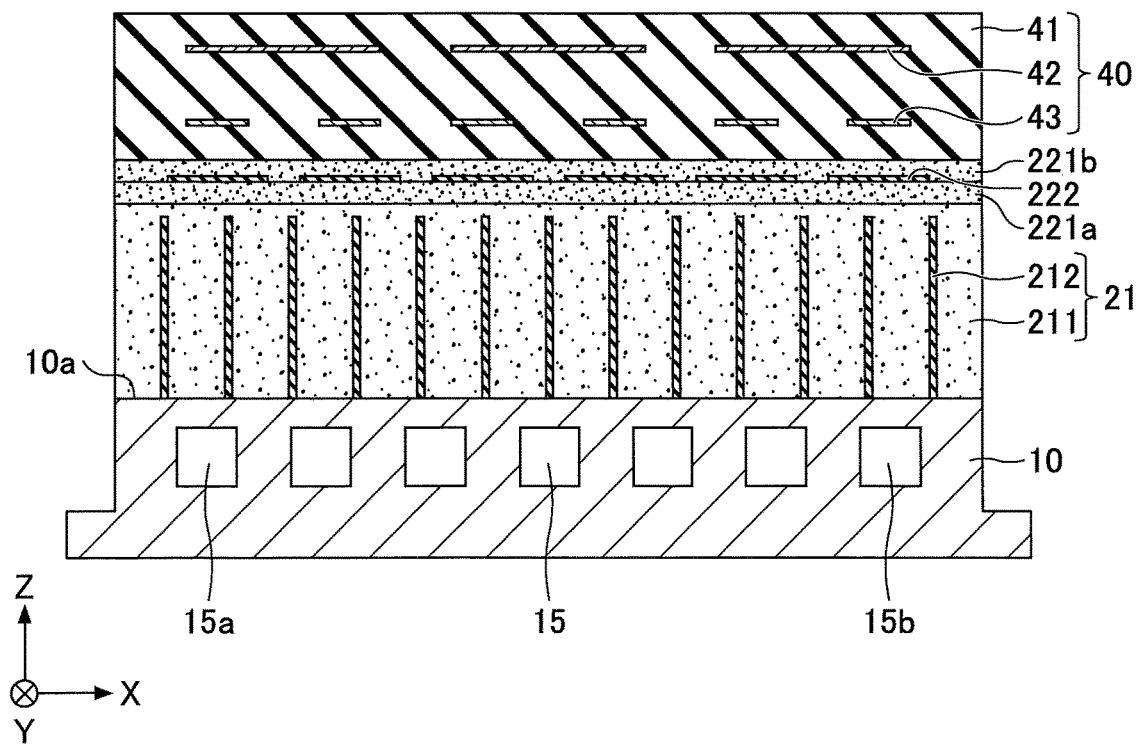

Next, in the process depicted in FIG. 2D, the upper surface of the insulating resin film 221a is laminated with an insulating resin film 221b so that the insulating resin film 221b covers the heat transfer materials 222. It is preferable to laminate the insulating resin film 221a with the insulating resin film 221b in a vacuum because doing so makes it possible to prevent inclusion of voids. The insulating resin film 221b is left semi-cured without being completely cured.

Next, the electrostatic chuck 40 having the electrostatic electrode 42 and the heating element 43 buried in the substrate 41 is formed by a known manufacturing method that includes processes such as forming a via in a green sheet, filling the via with conductive paste, forming an electrostatic electrode, forming a heating element, and stacking another green sheet on the green sheet and performing firing. Then, the electrostatic chuck 40 is placed on the semi-cured insulating resin film 221b.

Next, while pressing the electrostatic chuck 40 toward the baseplate 10, the insulating resin films 221a and 221b are heated to or above a curing temperature to be cured. As a result, the insulating resin films 221a and 221b are combined together as one piece into the resin 221, so that the second layer 22 having the heat transfer materials 222 buried in the resin 221 is formed on the first layer 21. Consequently, the substrate fixing device 1 in which the electrostatic chuck 40 is stacked on the upper surface 10a of the baseplate 10 with the adhesive layer 20 (the first layer 21 and the second layer 22) interposed between the baseplate 10 and the electrostatic chuck 40 is completed.

Thus, according to the substrate fixing device 1, the adhesive layer 20 bonding the baseplate 10 and the electrostatic chuck 40 together includes at least two layers of the first layer 21 and the second layer 22. The first layer 21 on the baseplate 10 is so formed that the thermal conductivity of the first layer 21 is higher in the stacking direction (Z-direction) than in the plane direction (XY in-plane direction), and the second layer 22 on the electrostatic chuck 40 is so formed that the thermal conductivity of the second layer 22 is higher in the XY in-plane direction than in the Z-direction. The first layer 21 is thicker than the second layer 22.

Causing the adhesive layer 20 to include at least two layers of the first layer 21 and the second layer 22 makes it possible to increase latitude in designing the thickness of the first layer 21 and the second layer 22. For example, causing the first layer 21 to be thicker than the second layer 22 makes it possible to reduce thermal stress due to the difference in coefficient of thermal expansion between the baseplate 10 and the electrostatic chuck 40 to reduce the generation of cracks in the resin 211 of the first layer 21 and the resin 221 of the second layer 22. Furthermore, it is possible to reduce the occurrence of delamination at the interface between the baseplate 10 and the resin 211 and the interface between the resin 221 and the electrostatic chuck 40.

Furthermore, the thermal conductivity of the first layer 21 on the baseplate 10 is higher in the Z-direction than in the XY in-plane direction. Therefore, even when the first layer 21 is formed thick to reduce the generation of cracks and the occurrence of delamination in the adhesive layer 20, it is possible to improve the thermal response of the adhesive layer 20 in the Z-direction. For example, the thermal response of the adhesive layer 20 in the Z-direction is improved compared with the case where an adhesive layer whose thermal conductivity is higher in the XY in-plane direction than in the Z-direction is formed to be as thick as the first layer 21 and the case where an adhesive layer containing a substantially spherical filler (an adhesive layer whose thermal conductivity does not differ between directions) is formed to be as thick as the first layer 21.

Furthermore, the thermal conductivity of the second layer 22 on the electrostatic chuck 40 is higher in the XY in-plane direction than in the Z-direction. Therefore, compared with, for example, the case where an adhesive layer contains a substantially spherical filler, it is possible to improve the thermal uniformity of the second layer 22 in the XY in-plane direction. As a result, it is possible to improve the controllability of the surface temperature of the electrostatic chuck 40.

Furthermore, because the generation of cracks and the occurrence of delamination in the adhesive layer 20 are reduced by forming the first layer 21 thick, the second layer 22 can be formed as thin as possible. As a result, the second layer 22 does not hinder thermal response in the Z-direction. Therefore, it is easier to ensure thermal response in the Z-direction for the adhesive layer 20 as a whole.

Figure 3:
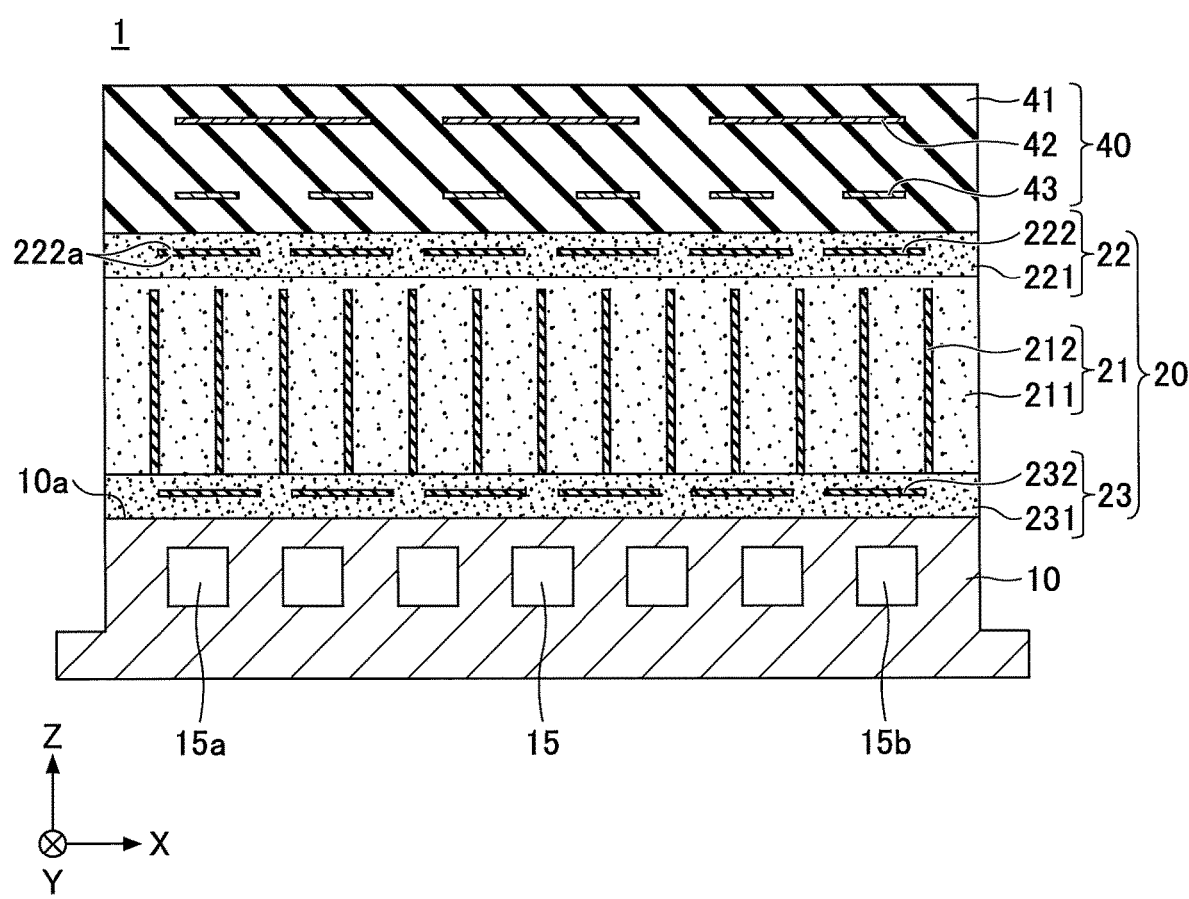
FIG. 3 is a simplified sectional view of the substrate fixing device according to a variation of the embodiment of the present invention.

In addition to the first layer 21 and the second layer 22, the adhesive layer 20 may further include another layer. For example, as illustrated in FIG. 3, a third layer 23 whose thermal conductivity is higher in the XY in-plane direction than in the Z-direction and that is approximately as thick as the second layer 22 may be provided between the first layer 21 and the upper surface 10*a* of the baseplate 10. The third layer 23 may have the same configuration as the second layer 22 and include, for example, a resin 231 and a large number of anisotropic heat transfer materials 232 contained in the resin 231. The thermal conductivity of the heat transfer materials 232 is higher in the XY in-plane direction than in the Z-direction. Providing the third layer improves thermal uniformity on the baseplate 10 side. Therefore, heat can be swiftly transferred between the first layer 21 and the baseplate 10 through the third layer 23.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, examples of objects to be attracted to a substrate fixing device according to embodiments of the present invention include, in addition to semiconductor wafers (such as silicon wafers), glass substrates used in the process of manufacturing, for example, liquid crystal panels.

What is claimed is:

1. A substrate fixing device comprising: a baseplate; an adhesive layer on the baseplate; and an electrostatic chuck on the adhesive layer, wherein the adhesive layer includes a first layer and a second layer, the second layer being interposed between the first layer and the electrostatic chuck, wherein a thermal conductivity of the first layer in a stacking direction is higher than a thermal conductivity of the first layer in a plane direction, the stacking direction being a direction in which the baseplate, the adhesive layer, and the electrostatic chuck are stacked, the plane direction being perpendicular to the stacking direction, wherein a thermal conductivity of the second layer in the plane direction is higher than a thermal conductivity of the second layer in the stacking direction, and wherein the second layer includes a resin; and a carbon sheet in the resin, the carbon sheet including main surfaces parallel to the plane direction, wherein the resin directly covers each of the main surfaces of the carbon sheet; wherein the second layer is thinner than the first layer.

2. The substrate fixing device as claimed in claim 1, wherein the first layer includes
   a resin; and
   a carbon nanotube in the resin of the first layer, the carbon nanotube being elongated in the stacking direction.

3. The substrate fixing device as claimed in claim 1, wherein the carbon sheet is a graphite sheet or a graphene sheet.

4. The substrate fixing device as claimed in claim 1, wherein
   the adhesive layer further includes a third layer closer to the baseplate than is the first layer, and
   a thermal conductivity of the third layer in the plane direction is higher than a thermal conductivity of the third layer in the stacking direction.

5. The substrate fixing device as claimed in claim 4, wherein the third layer is thinner than the first layer.

6. The substrate fixing device as claimed in claim 1, wherein the second layer is stacked directly on the first layer in the stacking direction.

7. A substrate fixing device comprising: a baseplate; an adhesive layer on the baseplate; and an electrostatic chuck on the adhesive layer, the electrostatic chuck including a substrate and a heating element buried in the substrate, wherein the adhesive layer includes a first layer and a second layer, the second layer being between the first layer and the electrostatic chuck, wherein a thermal conductivity of the first layer in a stacking direction is higher than a thermal conductivity of the first layer in a plane direction, the stacking direction being a direction in which the baseplate, the adhesive layer, and the electrostatic chuck are stacked, the plane direction being perpendicular to the stacking direction, wherein a thermal conductivity of the second layer in the plane direction is higher than a thermal conductivity of the second layer in the stacking direction, and wherein the second layer includes a resin; and a carbon sheet in the resin, the carbon sheet including main surfaces parallel to the plane direction, wherein the resin directly covers each of the main surfaces of the carbon sheet; wherein the second layer is thinner than the first layer.

8. The substrate fixing device as claimed in claim 1, wherein
   the carbon sheet includes a plurality of carbon sheets including respective main surfaces parallel to the plane direction, and
   the plurality of carbon sheets are placed at predetermined intervals in the plane direction.

9. The substrate fixing device as claimed in claim 7, wherein
   the carbon sheet includes a plurality of carbon sheets including respective main surfaces parallel to the plane direction, and
   the plurality of carbon sheets are placed at predetermined intervals in the plane direction.

* * * * *